(12) United States Patent
Hofmann et al.

(10) Patent No.: US 6,750,658 B2
(45) Date of Patent: Jun. 15, 2004

(54) INDUCTIVE SAFETY SENSOR FOR MONITORING DOORS AND GATES

(75) Inventors: Andreas Hofmann, Bünde (DE); Matthias Krühler, Bückeburg (DE)

(73) Assignee: Bernstein AG, Porta Westfalica (DE)

( * ) Notice: Subject to any disclaimer, the term of this patent is extended or adjusted under 35 U.S.C. 154(b) by 20 days.

(21) Appl. No.: 10/102,964

(22) Filed: Mar. 22, 2002

(65) Prior Publication Data

US 2002/0175812 A1 Nov. 28, 2002

(30) Foreign Application Priority Data

Mar. 23, 2001 (DE) .......................... 201 05 164

(51) Int. Cl.$^7$ .......................... G01R 207/28; H01F 5/00
(52) U.S. Cl. .................................. 324/654; 324/27.16
(58) Field of Search ................................ 324/654, 655, 324/207.16, 637, 642; 340/547

(56) References Cited

U.S. PATENT DOCUMENTS

| 4,219,740 | A | * | 8/1980 | Little .......................... 307/116 |
| 4,649,341 | A | * | 3/1987 | Ulbrich et al. ......... 324/207.16 |
| 4,859,942 | A | * | 8/1989 | Charton et al. ........ 324/207.16 |
| 5,077,528 | A | * | 12/1991 | Brosh .......................... 324/655 |
| 5,504,425 | A | * | 4/1996 | Fericean et al. ....... 324/207.16 |
| 6,204,659 | B1 | * | 3/2001 | Yamamoto ............. 324/207.16 |

* cited by examiner

*Primary Examiner*—Albert Decady
*Assistant Examiner*—James Kerveros
(74) *Attorney, Agent, or Firm*—Barnes & Thornburg (57) ABSTRACT

Inductive safety sensor for monitoring the condition of doors and gates, particularly of elevators, having a sensor device for sensing a target which is designed such that it emits a signal only when sensing a target made of a defined material and switches from a first constant current to another constant current when the target is sensed.

8 Claims, 10 Drawing Sheets

| SET | RESET | Q |
|-----|-------|---|
| L | L | H |
| L | H | H |
| H | L | L |
| H | H | NO CHANGE |

INDUCTIVE SAFETY SENSOR FOR MONITORING DOORS AND GATES

BACKGROUND AND SUMMARY OF THE INVENTION

The invention relates to an inductive safety sensor for monitoring doors and gates and, more particularly, of elevators and/or lifts.

Two-channel inductive safety sensors are used for monitoring electrically and mechanically actuated revolving doors, sliding doors, rolling gates, flaps and hatches. Safety sensors ensure a secure monitoring of the open and closed position of doors and gates. Whereas commercially available inductive proximity switches can be actuated by means of virtually all metallic objects, the invention starts with the idea of further developing the proximity switch such that it emits a signal only by means of an especially constructed actuating element. It is an object of the invention to provide such an inductive proximity switch which has a constructively simple design.

The invention achieves this task by a safety sensor for monitoring the condition of doors and gates, particularly of elevators, that has a sensor device, which emits a signal only when sensing a target made of a defined material and switches from a first constant current to another constant current.

In contrast to the single-channel mechanical safety switches of the prior art, the safety sensors according to the invention, in particular, have the following advantages:

The sensor and the target operate in a contactless manner.

No mechanical wear occurs as a result of friction or burn-up at the contacts.

The sensor and the target can have a two-channel construction.

The sensor and the target can be mutually adapted. As a result of suitable measures, it can be ensured that a manipulation by foreign targets (non-ferrite) is excluded. A manipulation by magnets, jumpers and similar materials is, therefore, not possible. An internal signal evaluation takes place by way of interference-immune phase demodulation.

Protection Type IP67 can be implemented.

Several switch points can be securely monitored.

Changes of the distance between the sensor and the target by material fatigue are detected and are reported by the safety bus system to, for example, a control unit (preventive maintenance).

As a result of the linkage to a safety bus system, such as the applicant's (CAN OPEN SAFETY), the output signals are monitored in a redundant manner. The signal transmission to the bus node takes place by interference-immune current loops.

The fastening of the safety sensor can take place in a simple manner by thread bolts or internal threads.

According to a variant, a balancing of the operating data of the sensor (switching interval) can be implemented by an advantageously uncomplicated construction of the sensor coil.

According to an embodiment, the sensor reacts only to ferrite, for example, and, in the event of a detection, switches from one constant current to another constant current. This permits line monitoring because operating currents other than the defined currents indicate a cable interference.

For safety-related reasons, the sensor has a redundant construction; that is, each sensor housing contains two sensor systems which are mutually, completely separated, with the exception of the positive supply voltage. The two systems are identical, with the exception of the excitation frequency, which must differ slightly in order to prevent a mutual influencing. In the further course, only one system which therefore be discussed.

Other aspects of the present invention will become apparent from the following detailed description of the invention, when considered in conjunction with accompanying drawings.

DETAILED DESCRIPTION OF THE PREFERRED EMBODIMENTS

First, a block diagram of the sensor S with the target T according to FIG. 1 will be described. A sensor S is arranged, for example, in a part of a door (not shown here), and the target—if it is to be monitored whether the door is open or closed—is arranged in a second part of the door which is movable relative to the first part. The construction of this sensor S is as follows.

An oscillator 1 generates a crystal-precise rectangular oscillation which is supplied to two additional modules. By way of a resistor R5, the signal drives an oscillating circuit 2 consisting of capacitor C1 and indicator L1, which reacts to field changes by external objects. The signal from the oscillator 1 is also supplied to a phase comparator 3 which compares the phase of this signal with the phase of the oscillating circuit 2.

Since the phase comparator 3 processes only digital signals, the sinusoidal oscillation of the LC circuit 2 is first fed to a zero crossing detector (comparator) 4, which converts the sinusoidal oscillation into a square wave signal. The phase comparator 3 is designed such that it reacts only to negative phase angles. On the output of the phase comparator 3, a PWM signal is generated whose pulse to separation ratio is a measurement of the change of the LC circuit.

The PWM signal is transformed by an integrator 5 into a direct voltage following the pulse/separation ratio and is fed to a threshold switch 6. The threshold switch 6 is dimensioned such that only the change of the oscillating circuit which is caused by a special material (ferrite, for example) at a precisely defined interval from the sensor results in a switching of this switch. As a result of this operation, another current is added to the operating current by a connected resistor. Because the entire circuit is maintained at a constant voltage by a controller 7, the voltage change before the threshold value switch 6 has therefore become a current change by a voltage to current transformation.

Additional figures illustrate, among others, additional details of the above-explained components of the sensor according to the invention. The individual circuit components will be explained in detail with reference to the additional figures.

Figure 2:
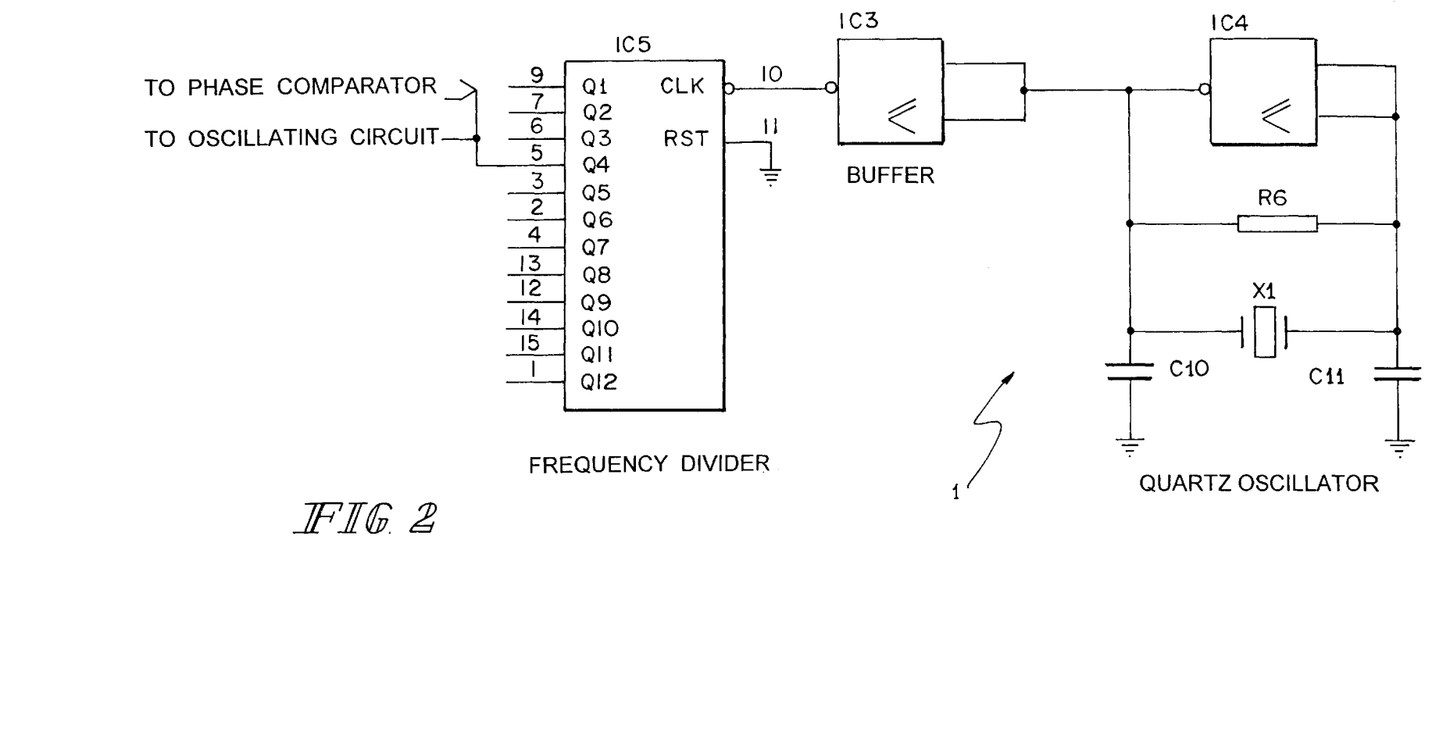
FIG. 2 is a schematic diagram of an oscillator for an inductive sensor according to the invention.

FIG. 2 shows the detailed construction of the oscillator 1. A precision oscillator 1 includes the following components: inverters IC3 and IC4, frequency divider IC5, crystal X1, capacitors C10 and C11 and resistor R6. The combination with the frequency divider IC5 is based on cost because, as a result, very inexpensive quartzes in the megahertz range can be used. Also, it offers a maximum of flexibility with respect to the frequency selection. A last reason is the absolute symmetry (pulse to separation ratio=1) of the square wave signal. Because the inputs of the frequency divider IC5, for example, an HC4040, are edge-triggered, the signal of gate or inverter IC4 is buffered by the gate or inverter IC3.

Figure 1:
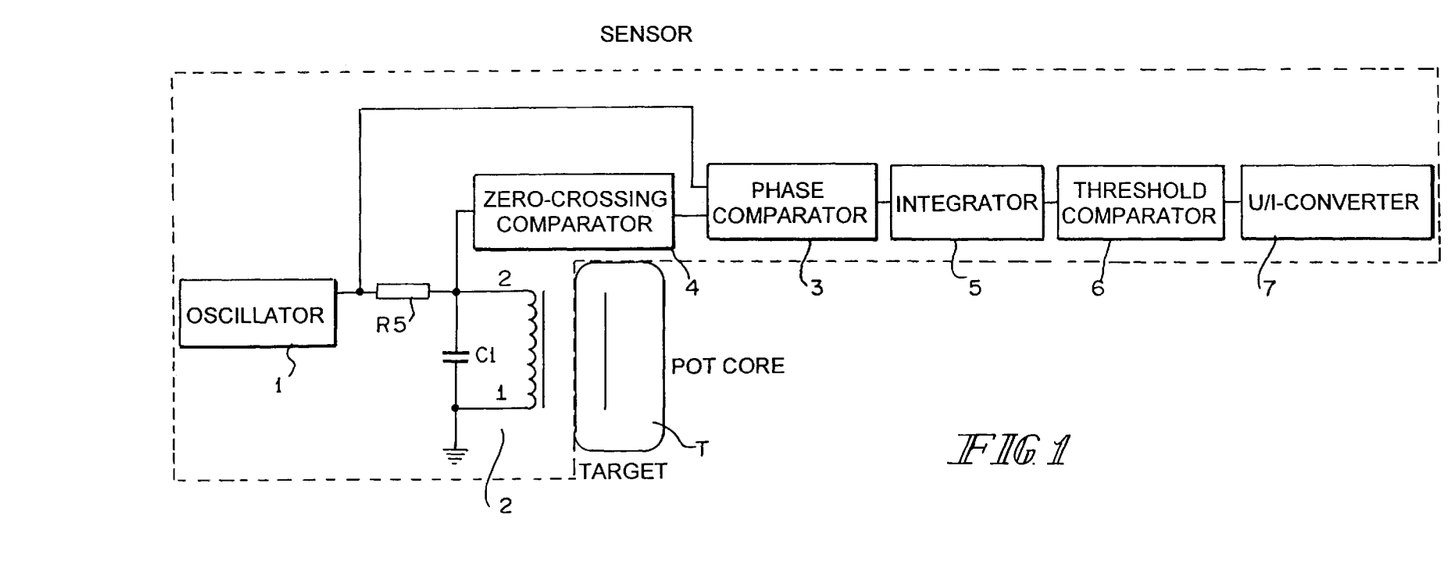
FIG. 1 is a block diagram of an inductive sensor according to the invention.

According to FIG. 1, the rectangular oscillation is supplied by the resistor R5 to the oscillation circuit 2 with the capacitors C1 and the coil L1. The size of the resistor R5 is in the order of the active resistance of the LC circuit at resonance.

The rough position of the excitation frequency depends on the size of the ferrite coil or the quality maximum (parameter of the ferrite coil independently of the resonance of the LC circuit) of this coil in order to achieve maximal sensitivity.

The position of the excitation frequency with respect to the resonance frequency decisively determines the behavior of the sensor with respect to the different materials (targets). In principle, several different detection behaviors can be achieved. In order to differentiate ferrite from other materials according to the demands, an excitation frequency must be selected at which, for all proximity distances, phase angles occur for just this material which are achieved in no other damping situation. The precise position of this point can be determined in that, above the frequency, impedances |Z| and phase angles Phi are measured in the case of different damping materials (ferrite, iron, nonferrous heavy metals) at different distances (0<s<sn).

Figure 3A:
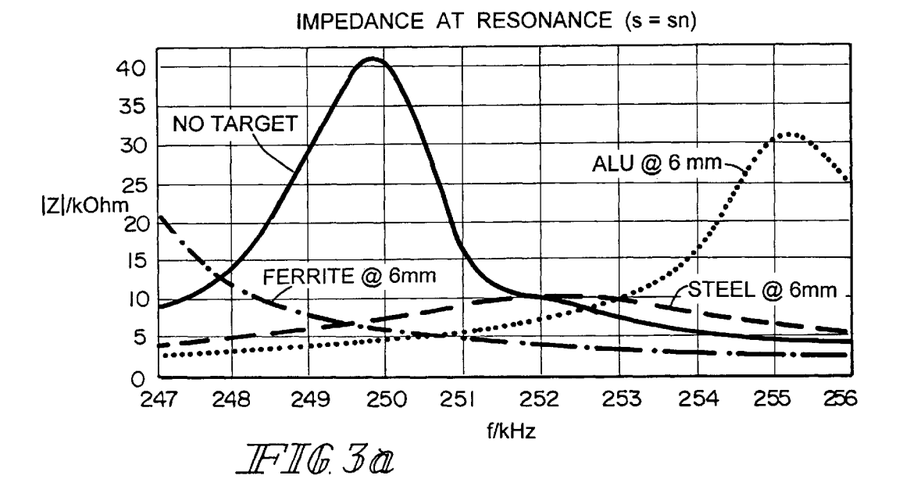
FIGS. 3a and 3b are diagrams which reflect the behavior of the impedance when various targets are used in the resonant proximity.
Figure 3B:
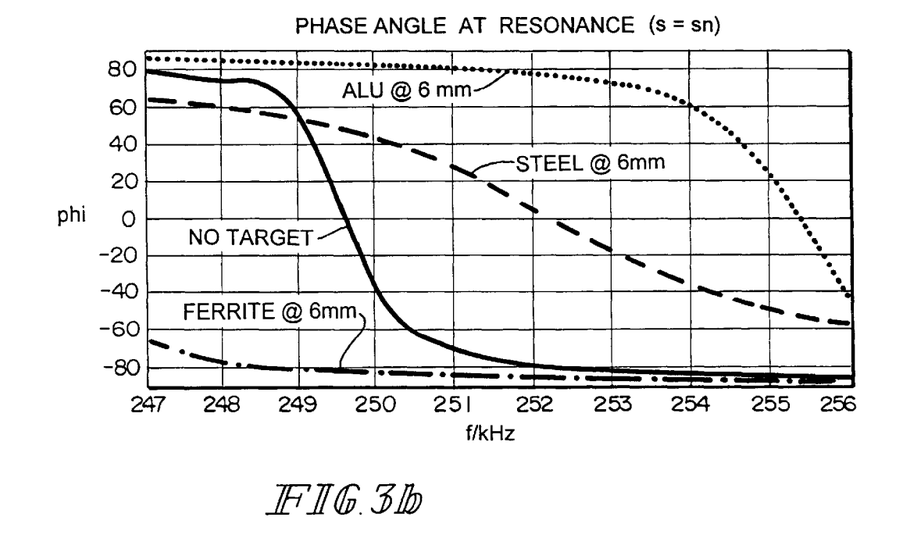

FIGS. 3a and 3b show graphs for undamped or no target, ferrite, steel and aluminum, within the resonance of the coil, at various frequencies for the impedance in resonance and the phase angle in resonance. The impedance is maximum at a zero phase angle for no target, ferrite or steel. The maximum for aluminum at zero phase angle is at a substantially lower frequency off the chart of FIGS. 3a and 3b.

Figure 4A:
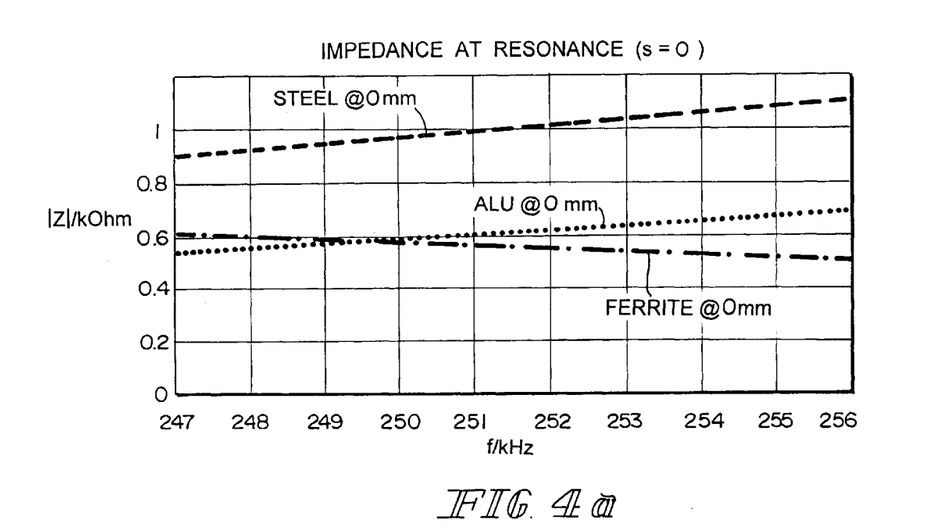
FIGS. 4a and 4b are diagrams which reflect the behavior of the phase angle when various targets are used in the resonant proximity.
Figure 4B:
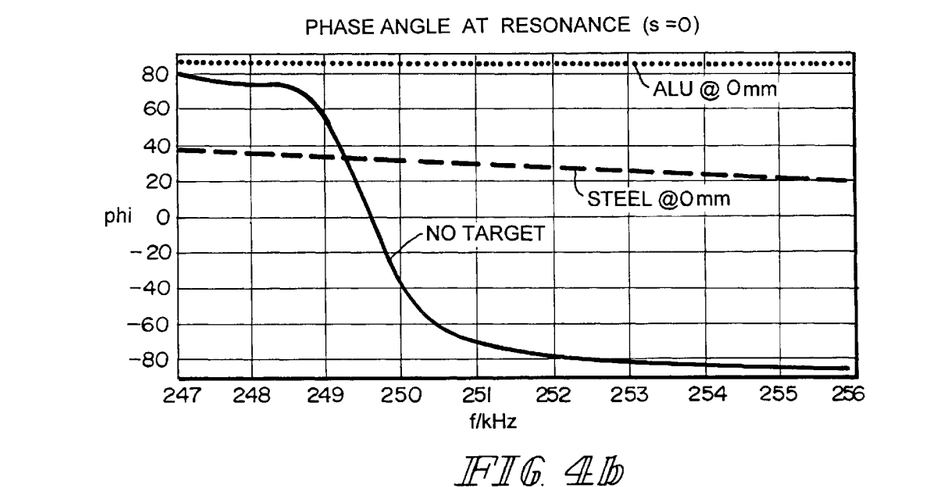

FIGS. 3a and 3b show the materials at a distance SN, and FIGS. 4a and 4b show the impedance and phase angle over the same frequency range at a distance of zero. The distance for 3a is 6 millimeters. In FIG. 4a, the undamped impedance or no target is not shown since it is off the chart and is the same as in FIG. 3a. With respect to the ferrite, it is barely visible, but it has a constant 90 degree phase angle.

The adjoining phase comparator 3 is designed such that it can react only to negative phase angles which are caused by materials of a high magnetic permeability. The resonance frequency of the LC circuit 2 is usefully designed such that the excitation frequency is situated on the trailing edge of the resonance curve. Here, the sensor exhibits its highest sensitivity. Because of the very narrow bandwidth of the LC circuit, these two frequency values differ only by several Hertz. Consequently, the oscillating circuit 2 has to be balanced because the precise position of the resonance cannot be achieved with the usual component tolerances.

Furthermore, this results in the demand to balance the LC circuit 2 as such. This led to the construction of coils which can be balanced according to FIG. 5.

Figure 5:
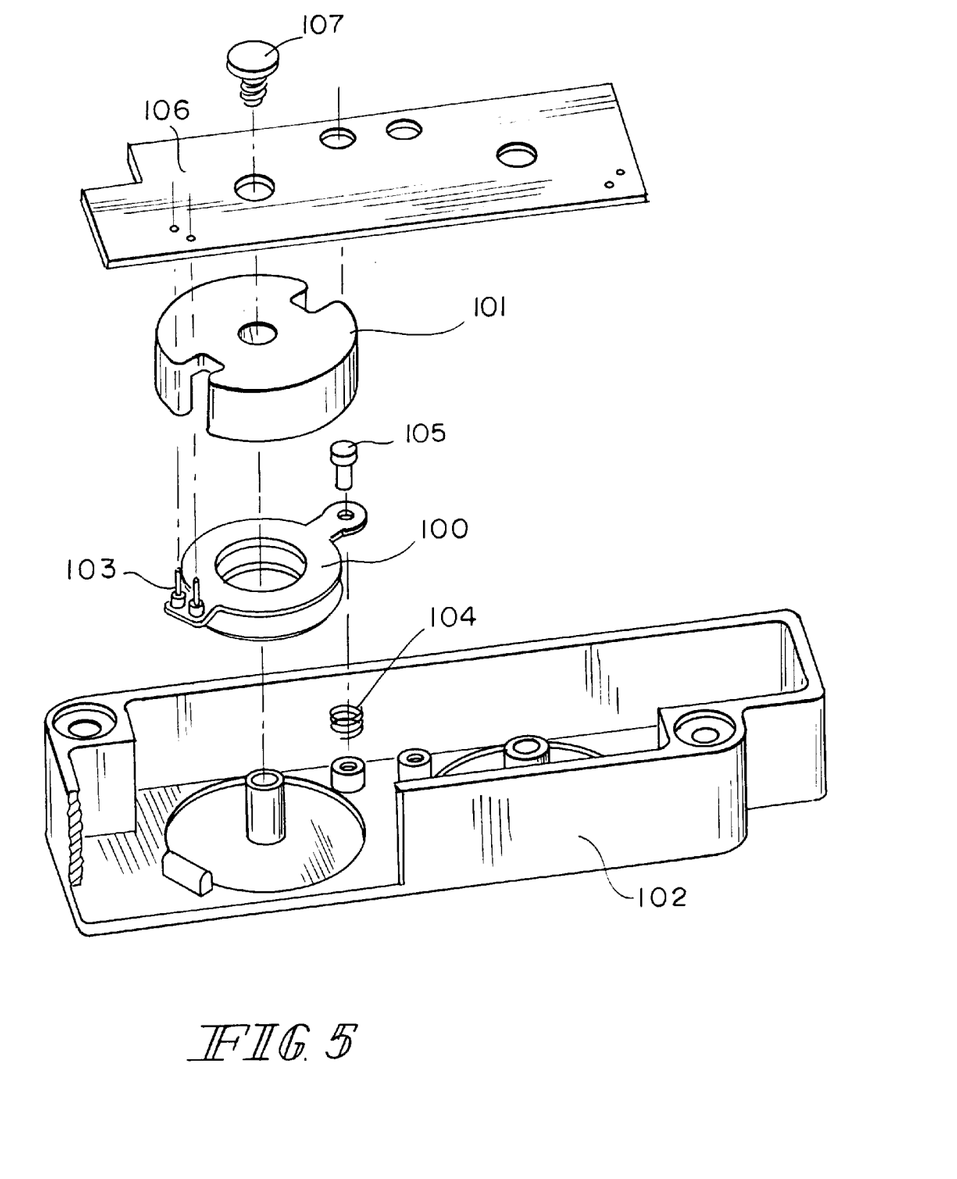
FIG. 5 is an exploded view of a coil for the sensor according to the invention.

Deviating from the conventional coils for proximity switches, in this construction, the wound body 100 was designed to be slightly flatter, and the coils can be adjusted in its position by an adjusting mechanism. Only one of a pair of coils is shown in FIG. 5. The wound bodies 100 are inserted into a housing 102. They have terminal pins 103, and their height can be adjusted by the spring 104 and the screw 105. The pot core 101, the printed circuit board 106 as well as the wound body 100 are fixed at the housing by a fixing pin 107.

As a result, inductivity changes of 10% can be achieved which are sufficient for balancing the tolerances to be expected in the winding and in the core material. The balancing will then take place as follows: The sensor is damped by a desired target at the nominal switching interval. The winding body 100 position is adjusted by screw 105 until the output signal changes (switches). After the adjusting, the complete sensor is sealed by epoxy resin in order to ensure a durable stability and resistance with respect to environmental influences.

According to the definition, the sensor should react only to a certain counterpart or target. The target is naturally accommodated in a separate housing and electronically consists only of two pot cores of the same construction, as those used in the sensor. Under defined installation conditions, the pot core halves are situated opposite one another in pairs. The line-of-force path of the LC circuit is now drastically reduced, which results in an increase of inductivity and therefore in a lowering of the resonance frequency.

Figure 6:
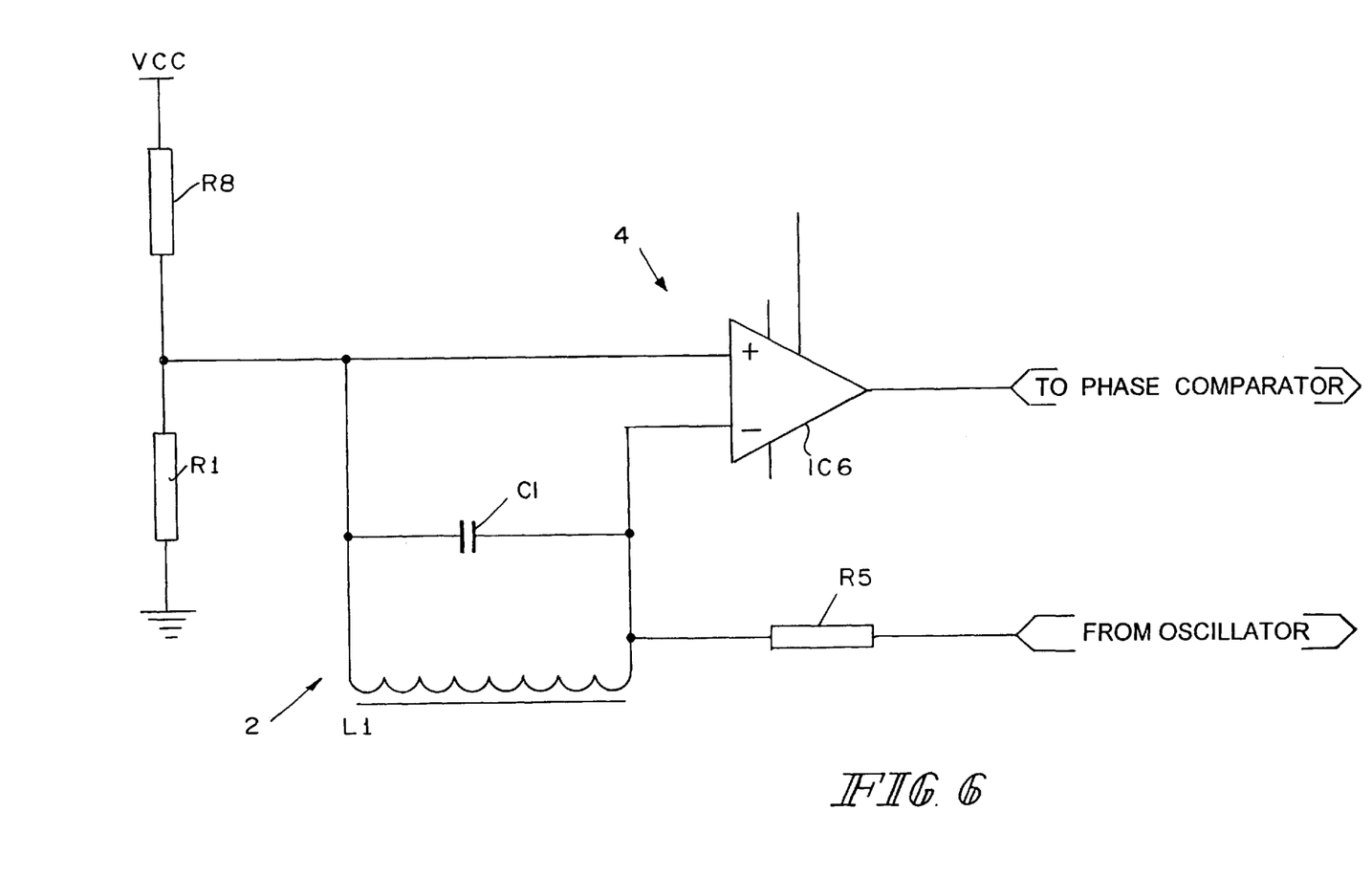
FIG. 6 is a schematic diagram of a zero crossing detector for a sensor according to the invention.

In the following, the zero crossing detector (comparator) 4 will be described by means of FIG. 6. The base of the LC circuit from C1 and L1 is on half the operating voltage. This point is also situated on the non-inverting input of the comparator 4 (IC6). This voltage is generated by the resistors R1, R8 connected in series between ground and Vcc.

With respect to the phase comparator 3, it should be noted that normally EXCLUSIVE-OR gates are used for the phase detection. The basic circuit application also uses this possibility which in this application would, however, be difficult, because it cannot differentiate between phase angles with respect to the sign.

Figure 7A:
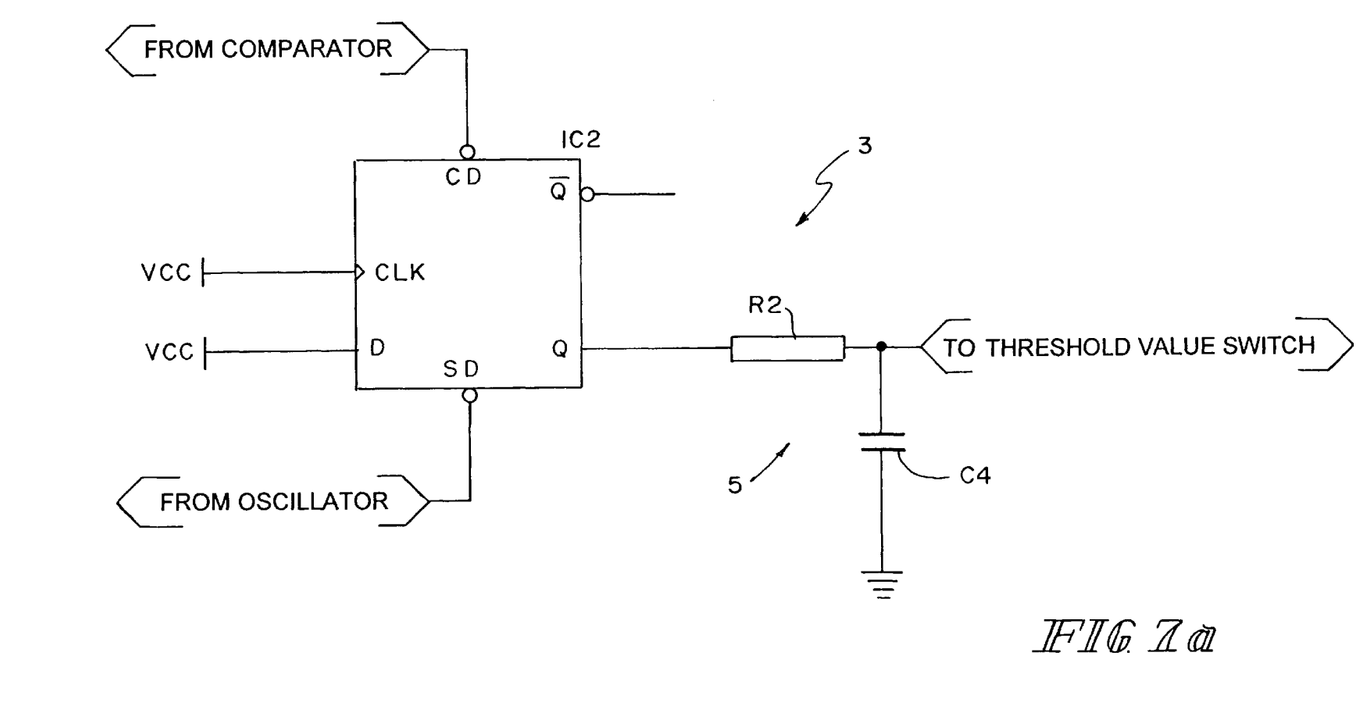
FIG. 7a is a schematic diagram of a phase comparator for a sensor according to the invention.
Figure 7B:
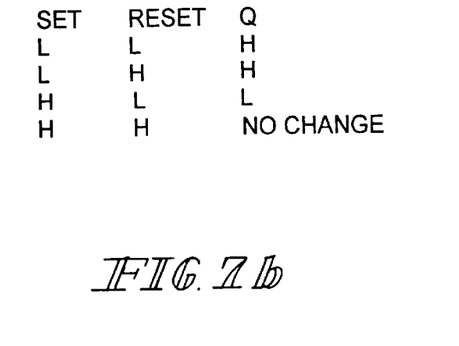
FIG. 7b is a truth table for a phase comparator.

If, instead of the EXCLUSIVE-OR gate, a D Flip-Flop in a suitable arrangement is used, as shown in FIG. 7a, it is possible to completely extract the reaction to the undesired positive phase angles. Under the condition that the clock inputs and data inputs of the delay element are constantly on a high potential, the truth table can be shown in a simplified manner as follows:

| Set | Reset | Q |
|-----|-------|---|
| L | L | H |
| L | H | H |
| H | L | L |
| H | H | No Change |

Figure 7C:
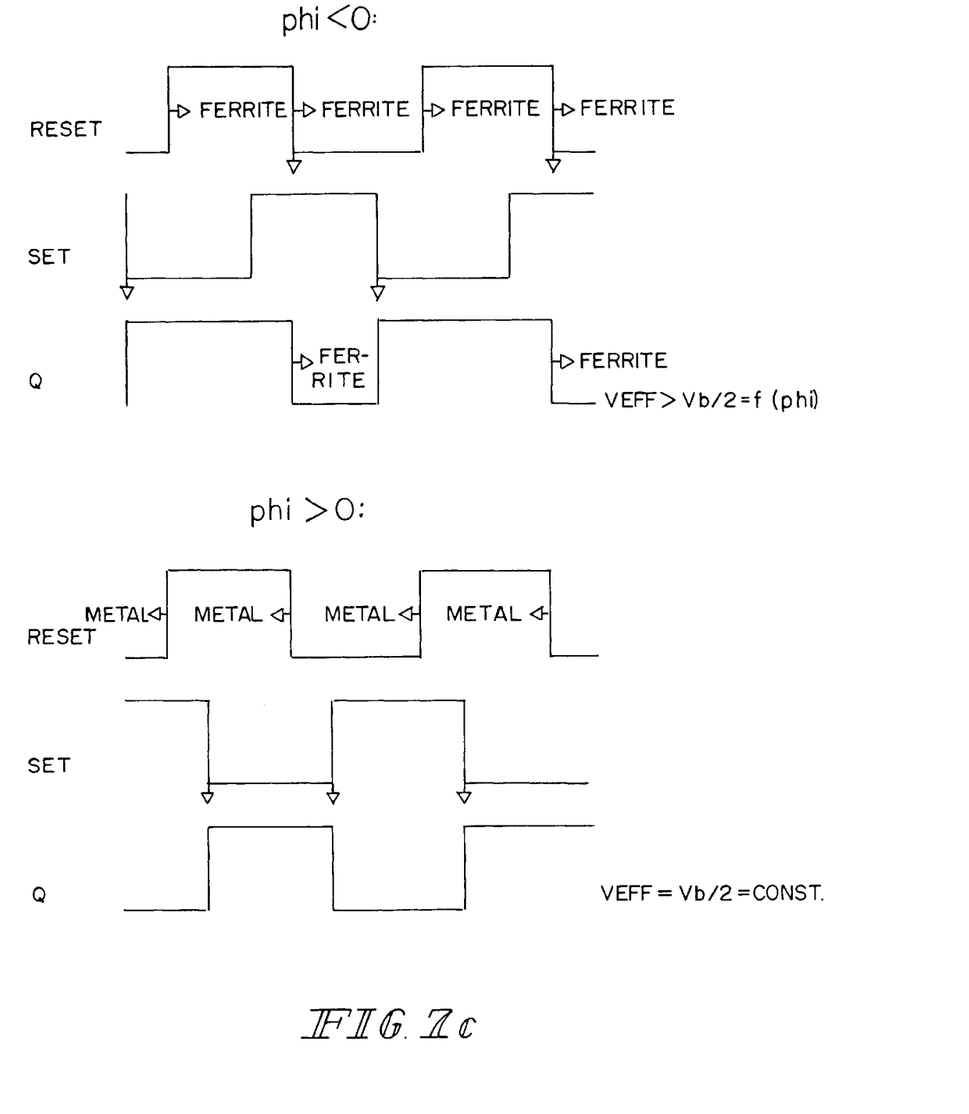
FIG. 7c is a graph of various phase diagrams.

The pulse diagrams (FIG. 7c) will now illustrate that only negative phase angles cause a change of the pulse separation ratio. For negative phase angles of ferrite, the pulse width is greater than that of the set signal, or, for metal, the pulse width of the output Q is the same as that of the set signal from the oscillator 1. If the reset signal from the oscillator 1 has a 1:1 ratio of pulse to separation from the desired target, the pulse to separation ratio of the sensor is greater than the pulse to separation ratio of the oscillator 1, as shown in the top FIG. 7c. For metal, the pulse to separation ratio of the oscillator 1 is equal to that of the pulse to separation ratio of the sensor.

The PWM signal from phase comparator 3 is integrated by resistor R2 and capacitor C4 of integrator 5. A time constant of approximately 1 ms is far above the period of the oscillator, but is still fast enough in order to achieve the required switching frequency. A direct voltage, which can vary between 2.5 V (corresponds to 0°) and 5 V (corresponds to −90°), is outputted which is proportional to the phase angle.

Figure 8:
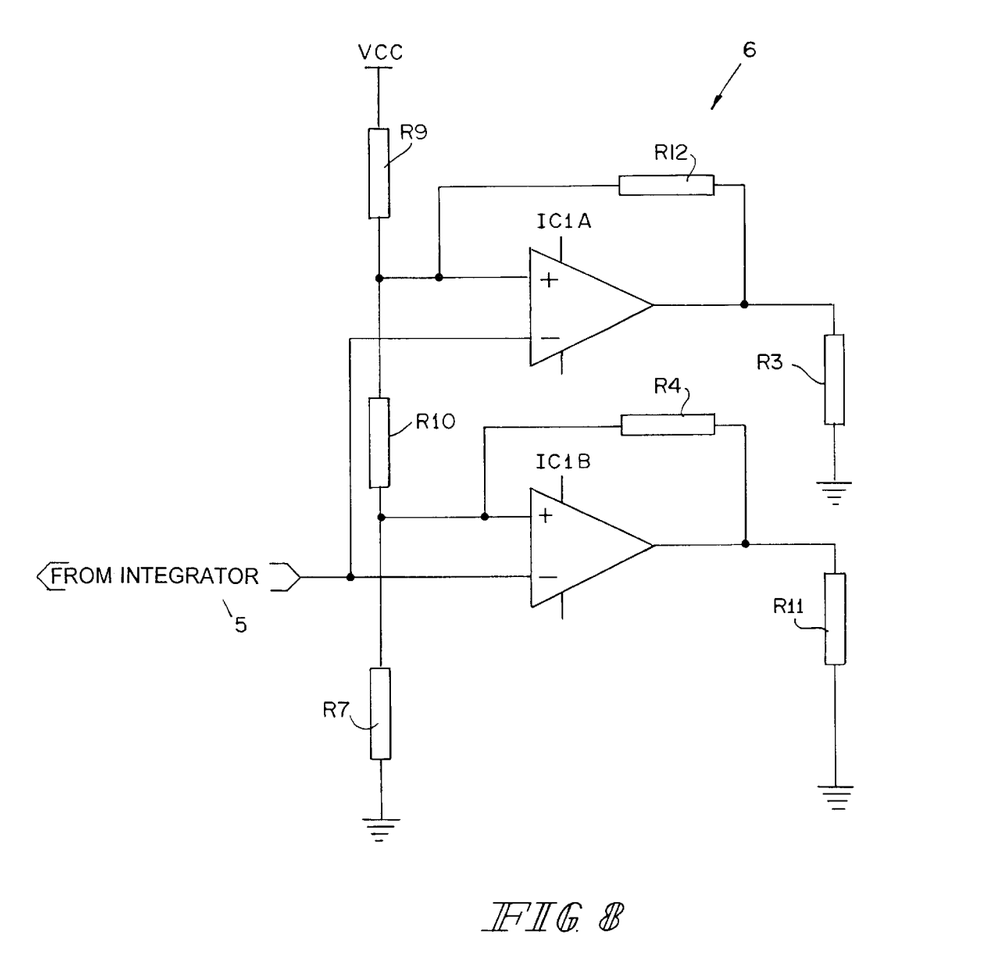
FIG. 8 is a schematic diagram of a threshold value switch for a sensor according to the invention.

The following is achieved by the threshold value switch 6 of FIG. 8. By means of the two comparators IC1A and IC1B of the IC1, in addition to the operating current, is almost constant, two more currents are produced and added to the operating current. One current is produced when the nominal or designed target switching interval is reached. A second current is produced when a slightly lower diagnostic switching interval (yellow or warning state) is reached. This second switching interval can be used for detecting a mechanical wear of the system. The threshold of the nominal switching interval results directly from the phase position or the frequency spacing which is necessary for detecting the target or ferrite. It is defined by resistors R7 and R9/R10 for each comparator. Switching hystereses are generated by resistors R4 or R12, respectively. The outputs appear across resistors R3 and R11.

Figure 9:
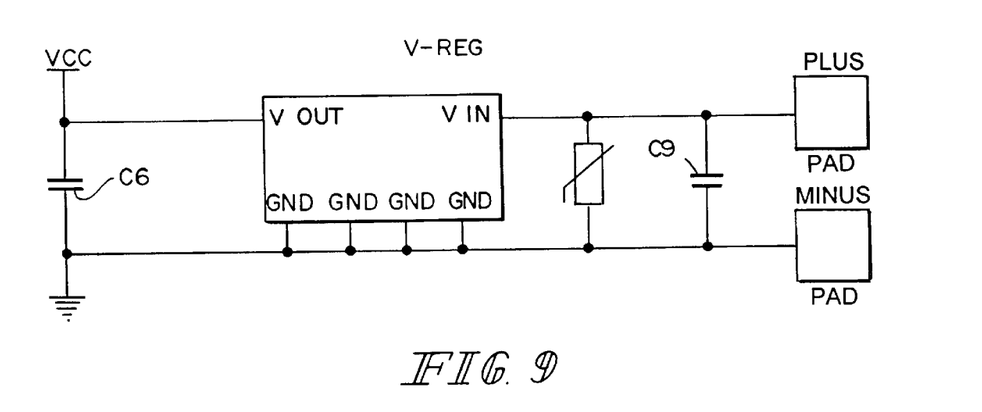
FIG. 9 is a schematic diagram of a voltage regulator for a sensor according to the invention.

The voltage controller or regulator V_REG of FIG. 9 provides a constant operating voltage of the entire sensor circuit. The entire sensor circuit operates completely with relative levels and would therefore be able to operate within wide ranges without such a precise voltage control. However, with the constant voltage, constant currents are generated which are independent of the input voltage. Thus, by means of this circuit arrangement, a controllable current source is implemented.

Landing Entrance Door and Cage Door Monitoring

The safety door switches are installed, for example, on an elevator landing entrance door and an elevator cage door for monitoring the locking and the closed position.

In the normal operation, it should not be possible to open a landing entrance door when the elevator cage is not situated behind this door or is situated within the unlocking zone. The safety door switches are used, for example, in the case of power-operated landing entrance doors driven jointly with the elevator cage door.

The mounting of the safety door switch on the landing entrance door takes place according to EN81 7.7.3.1. In the case of this application, the mechanical locking element is monitored by the safety door switch. The effective locking of the closed landing entrance door must precede the movement of the elevator cage. The elevator cage should not start before the locking device has engaged at least 7 mm. The safety door switch and target S-T monitors the position of the locking device in a two-channel manner. The required redundancy is ensured by the sensor node. The sensor node reports the position of the locking device to the bus master.

Closed Position

The safety door switches are used for monitoring the closed position according to EN 81 7.7.4.1, 7.7.6.2 and 8.9.2.

According to EN 81, the gap between the door blades or leaves should not be larger than 10 mm. If the distance between the door blades is larger than 10 mm, the elevator system should be brought into a secure condition. Should the gap, for example, be larger than 7 mm, this condition is detected by the safety door switch and by way of the safety bus additional information is supplied for adjusting the door.

By linking the elevator cage signals and the landing entrance door signals, it can, for example, be detected that, when the landing entrance door is opened (by an emergency unlocking), the elevator cage door or the elevator cage is not behind the landing entrance door. As a result of this analysis, the elevator system is brought into a secure condition.

When a mechanic opens the landing entrance door at the lowest stop in order to carry out maintenance work in the elevator shaft pit, he should actuate the emergency brake switch for safety purposes. Should the landing entrance door close before the emergency brake switch was actuated, the elevator system can start when an external call is present.

By analyzing the landing entrance door signals and the cage door signals, it is detected that a manipulation is present (landing entrance door was open; cage door closed). When this combination is present, a starting of the elevator system is prevented by the analysis of the signals in the control.

As a result of this combination, it is also ensured that a surfing on the cage roof as a result of the manipulation of the door switches is not possible.

In the case of mechanical door switches, such a logical linking of signals is not possible.

Although the present invention has been described and illustrated in detail, it is to be clearly understood that this is done by way of illustration and example only and is not to be taken by way of limitation. The spirit and scope of the present invention are to be limited only by the terms of the appended claims.

What is claimed is:

1. An inductive safety sensor comprising:
    a sensor device for sensing a target, the sensor emitting a signal only when sensing a target made of a defined material and switches from a first constant current to another constant current when the target is sensed;
    an oscillating circuit for sensing a target and an oscillator driving the oscillating circuit;
    the oscillating circuit being connected to a first input of a phase comparator which has another input which is connected with the oscillator; and
    wherein the phase comparator reacts exclusively to negative phase angles which are caused by materials with a high magnetic permeability than the target to produce a PWM signal, whose pulse to separation ratio is a measurement of the change of the output signal of the oscillating circuit.

2. The inductive safety sensor according to claim 1, wherein the PWM signal is transformed by an integrator into a direct voltage which is supplied to a threshold value switch which switches only for the change of the oscillating circuit which is caused by a special material at a precisely defined interval.

3. An inductive safety sensor comprising:

a sensor device for sensing a target, the sensor emitting a signal only when sensing a target made of a defined material and switches from a first constant current to another constant current when the target is sensed;

an oscillating circuit for sensing a target and an oscillator driving the oscillating circuit; and wherein a resonance frequency of the oscillating circuit is selected such that the excitation frequency is situated on the trailing edge of the resonance curve.

4. An inductive safety sensor comprising:

a sensor device for sensing a target, the sensor emitting a signal only when sensing a target made of a defined material and switches from a first constant current to another constant current when the target is sensed;

an oscillating circuit for sensing a target and an oscillator driving the oscillating circuit; and wherein the oscillating circuit of the sensor has balancing coils which are designed to be adjustable.

5. The inductive safety sensor according to claim 4, wherein the balancing coils have a flattened wound body and an adjusting mechanism for adjusting their position.

6. The inductive safety sensor according to claim 5, wherein the wound body is in a housing and the position is adjustable by a screw, acting against a spring.

7. An inductive safety sensor comprising:

a sensor device for sensing a target, the sensor emitting a signal only when sensing a target made of a defined material and switches from a first constant current to another constant current when the target is sensed;

a logic phase detector; and wherein, under the condition that clock inputs and data inputs of the logic phase detector are constantly on a high potential, the truth table is as follows:

| Set | Reset | Q |
|-----|-------|---|
| L | L | H |
| L | H | H |
| H | L | L |
| H | H | No Change. |

8. An inductive safety sensor comprising:

a sensor device for sensing a target, the sensor emitting a signal only when sensing a target made of a defined material and switches from a first constant current to another constant current when the target is sensed; and two comparators producing two additional currents, in addition to the operating current, which is almost constant;

wherein one additional current is produced when a nominal switching interval of a switch is reached, and a second additional current is produced when a slightly lower diagnostic switching interval of the switch is reached, the second switching interval being used for detecting mechanical wear of the system.

* * * * *